(12) United States Patent
Prothero et al.

(10) Patent No.: US 11,876,569 B2
(45) Date of Patent: Jan. 16, 2024

(54) DEVICES, SYSTEMS, AND SOFTWARE INCLUDING SIGNAL POWER MEASURING AND METHODS AND SOFTWARE FOR MEASURING SIGNAL POWER

(71) Applicant: Astrapi Corporation, Dallas, TX (US)

(72) Inventors: Jerrold Prothero, Delray Beach, FL (US); Tanay Bhatt, Richardson, TX (US)

(73) Assignee: Astrapi Corporation, Dallas, TX (US)

( * ) Notice: Subject to any disclaimer, the term of this patent is extended or adjusted under 35 U.S.C. 154(b) by 68 days.

(21) Appl. No.: 16/819,126

(22) Filed: Mar. 15, 2020

(65) Prior Publication Data

US 2020/0366389 A1    Nov. 19, 2020

Related U.S. Application Data

(60) Provisional application No. 62/848,280, filed on May 15, 2019.

(51) Int. Cl.
  *H04B 17/318*    (2015.01)
  *H04B 17/00*    (2015.01)

(52) U.S. Cl.
  CPC ....... *H04B 17/318* (2015.01); *H04B 17/0087* (2013.01)

(58) Field of Classification Search
  CPC ... H04B 17/318; H04B 17/0087; H04L 27/00; H04L 27/02; H04L 27/2697; H04L 27/3494; H04L 27/3405; H04L 43/16; H04W 16/14; H04W 24/08
  See application file for complete search history.

(56) References Cited

U.S. PATENT DOCUMENTS

| | | | |
|---|---|---|---|
| 5,706,202 A | 1/1998 | Itahara | |
| 8,472,534 B2* | 6/2013 | Prothero | H04L 27/3494 375/259 |
| 8,861,327 B2* | 10/2014 | Prothero | H04L 27/0004 370/204 |
| 9,426,680 B2* | 8/2016 | Seely | H04W 24/04 |
| 9,900,796 B2* | 2/2018 | Seely | H04W 24/04 |
| 10,069,664 B2* | 9/2018 | Prothero | H04L 27/00 |
| 2012/0270537 A1 | 10/2012 | Weng et al. | |
| 2013/0158923 A1 | 6/2013 | Stanton et al. | |

(Continued)

OTHER PUBLICATIONS

Chu Haobing et al: "Is spiral modulation really useful?", Jan. 1, 2017, pp. 1-69, XP093043470, DOI: 10.14288/1.0340494, URL:https://open.library.ubc.ca/media/stream/pdf/24/1.0340494/4.

(Continued)

*Primary Examiner* — Steven S Kelley
(74) *Attorney, Agent, or Firm* — Law Office of Michael Antone, LLC; Michael Antone

(57) ABSTRACT

Systems, devices, software, and methods of the present invention enable frequency-based signal power analyses in software suitable for signal with either stationary and non-stationary spectrums. The methods that may be used throughout various systems including transmitters receivers, repeater, controllers, monitors, etc. and in software simulators to enable various signal power calculations and analyses, such as frequency spectrum analysis, throughout operating systems and that may be consistently applied in system design and operation simulations.

17 Claims, 9 Drawing Sheets

(56) References Cited

U.S. PATENT DOCUMENTS

| | | |
|---|---|---|
| 2015/0280752 A1 | 10/2015 | Harjani et al. |
| 2017/0272305 A1* | 9/2017 | Lu .......................... H04L 43/08 |
| 2017/0343652 A1 | 11/2017 | de Mersseman et al. |
| 2018/0017604 A1 | 1/2018 | Daw et al. |
| 2018/0091336 A1 | 3/2018 | Mody |
| 2018/0331770 A1* | 11/2018 | Dunsmore ........... H04B 17/318 |
| 2018/0351774 A1* | 12/2018 | Heinikoski ........... H04W 16/14 |
| 2019/0013974 A1 | 1/2019 | Prothero |
| 2019/0097741 A1* | 3/2019 | Vlachou .............. H04B 17/318 |
| 2021/0123959 A1* | 4/2021 | Prothero ................ G01R 23/18 |
| 2022/0077941 A1* | 3/2022 | Prothero ................ H04B 17/26 |

OTHER PUBLICATIONS

Matthew T Hunter et al: "Design of a 1-15 software defined, FPGA-based reconfigurable RF Measuring Receiver", Autotestcon, 2009 IEEE, IEEE, Piscataway, NJ, USA, (Sep. 14, 2009), pp. 374-379, XP031560304, ISBN: 978-1-4244-4980-4.

Gil Savir: "Scalable and Reconfigurable 1-15 G01R Digital Front-End for SDR Wideband H04B Channelizer", MSc Thesis, Sep. 25, 2006 (Sep. 25, 2006), pp. 1-69, XP055020395, Delft, NL URL:http://ce.et.tudelft.nl/publicationfiles/1206_716_Gil_Savir-MSc_thesis.pdf * chapters 2-4 *.

* cited by examiner

DEVICES, SYSTEMS, AND SOFTWARE INCLUDING SIGNAL POWER MEASURING AND METHODS AND SOFTWARE FOR MEASURING SIGNAL POWER

CROSS-REFERENCE TO RELATED APPLICATIONS

This application claims the benefit of and priority from U.S. Provisional Patent Application No. 62/848,280, filed on May 15, 2019, entitled "Devices, Systems, And Software Including Signal Power Measuring And Methods And Software For Measuring Signal Power", the entire contents of which is hereby incorporated by reference.

STATEMENT REGARDING FEDERALLY SPONSORED RESEARCH OR DEVELOPMENT

This invention was made with government support under Award #1738453 awarded by the National Science Foundation. The government has certain rights in the invention.

BACKGROUND OF THE INVENTION

Field of the Invention

The present invention relates in general to measuring signal power, and, more specifically to systems, devices, software, and methods to perform signal power measurements over a frequency spectrum for use in occupied bandwidth (OBW) and other frequency spectrum analyses.

Background Art

The data transmission capacity of a communication system depends generally on the number of communication channels that the system can support and the data transmission capacity of each communication channel. The number of channels that may be used in a given frequency range depends upon the frequency range, or bandwidth, that is occupied by each channel being transmitted by the system, which is known as the occupied bandwidth (OBW) of the channel. System channel layouts are based on a maximum expected OBW for each channel along with an additional guardband to determine the channel spacing as typically defined by the frequency range separating the center frequency of each channel.

A standard convention is to equate the OBW of a signal to the range of frequencies which contain 99% of the signal power. This or similar definitions of OBW require measuring signal power across frequencies, to get a power spectral density (PSD). This is most commonly accomplished using Fourier Transform (FT) methods, which are well-known in the art. However, FT methods represent the signal spectrum in terms of sinusoids with constant amplitude, i.e., as a stationary spectrum, which means the FT methods inherently cannot correctly measure OBW if the spectrum is changing over time, i.e., is not stationary.

The study of time-frequency analysis arose because of this problem and includes such techniques as the short-time Fourier Transform (STFT), generating the well-known spectrogram. STFT uses a sliding time-window, with a trade-off between time and frequency resolution. Joint time-frequency distributions are an alternative technique, in which a function is derived that is distributed simultaneously in the time and frequency domains. However, all of these techniques are based on the FT, which, despite sophisticated adaptations, is fundamentally not suited to the study of a time-varying spectrum. Effectively, applying the FT to a time-varying (non-stationary) spectrum requires finding time periods over which the spectrum can be considered to be approximately stationary (so that the assumptions of the FT are met) then stitching them together. Unfortunately, a priori knowledge of approximately stationary intervals is generally not known, which may be one of the reasons that the spectrum is being measured.

Real time spectrum analyzers ("RTSAs") capture signals over short intervals, which are then stored and analyzed using Fast Fourier Transform (FFT) algorithms. Some RTSAs may sequence the FFT results to show changes in the spectrum over time.

The stationary assumption becomes increasingly unworkable as the spectrum becomes increasingly non-stationary, as, for instance, in the case of signals generated using spiral modulation, which are continuously non-stationary. For additional information on spiral modulation, see, for example, U.S. Pat. No. 8,472,534 entitled "Telecommunication Signaling Using Non-Linear Functions", U.S. Pat. No. 8,861,327 entitled "Methods and Systems for Communicating", and U.S. Pat. No. 10,069,664 entitled "Spiral Polynomial Division Multiplexing" (SPDM), the contents of which are herein incorporated by reference in their entirety, except for the claims and any disclosure contrary to this disclosure, and Prothero, J., Islam, K. Z., Rodrigues, H., Mendes, L., Gutiérrez, J., & Montalban, J. (2019), Instantaneous Spectral Analysis. *Journal of Communication and Information Systems*, 34(1), 12-26, doi.org/10.14209/jcis.2019.2.

A different approach to OBW measurement known to the art is the hardware swept-tuned spectrum analyzer (HSTSA). Essentially, the HSTSA analyzes a physically-transmitted signal and uses filters to successively isolate particular frequency ranges ('bins') of the spectrum. The power in each frequency bin is measured, and the distribution of power across frequency bins can be used to measure the OBW.

Since the HSTSA does not use an FT, it inherently avoids the problems with FT-based OBW measurement described above. However, since the HSTSA sweeps through a frequency range, the assumption of a stationary spectrum remains over the duration of the sweep. In addition, the HSTSA requires physical signal transmission and is often an expensive piece of equipment that is not easily used outside of the laboratory.

The continuing demand for higher performance services from communication service customers of all types means there is a continuing need for data transmission/communication systems, device, software, and methods to enable those services.

BRIEF SUMMARY OF THE INVENTION

Systems, devices, software, and methods of the present invention enable frequency-based signal power analyses in software, thereby providing for a software frequency spectrum analyzer ("SSA") and other power signal analyses. By enabling signal power and frequency spectrum analyses to be performed in software, the present invention solves long-standing problems associated with making consistent spectrum measurements and enables spectrum analysis to be performed on both hardware and software generated signals. In hardware, the present invention may be used to enable system design, feedback, and control based on the actual OBW performance of the operational system. In software, the SSA may be used in software simulators to evaluate the simulated system performance, such as analyzing the OBW of simulated signals. Because the present invention may be applied to hardware & software generated signals, analyses may be performed consistently across hardware and software platforms.

The present invention may be employed with signals that have stationary or non-stationary spectrums. The present invention is particularly useful for signals where the spectrum to be measured is highly time-variant (non-stationary), because of the limitations of FT-based techniques. However, the methods are generally applicable and may be employed in combination with, or in lieu of, FT-based techniques on stationary spectrum signals.

Systems, devices, and methods of the present invention have an electrical signal input, which may have been generated in hardware by receiving an information carrying signal, such an optical or radio signals, or in software by simulating the preceding reception. The analysis of the input signal may be performed pursuant to various analysis inputs provided by the user. For example, prior to analyzing the input signal, the user may specify a frequency spectrum range having a minimum frequency (f_min) and a maximum frequency (f_max) and define at least one frequency bin within the frequency spectrum range and having a frequency bin width, f_width, and a source frequency, f_source, associated with each frequency bin.

A target intermediate frequency (f_target) may be specified for each frequency bin. The target frequency may be the same for each frequency bin, or may be varied by the skilled artisan. In some applications, it may be desirable to make the target frequency the same for all frequency bins, so the same filter may be used for each bin.

An input signal sample time interval, dt, defining a sampling frequency, Fs=1/dt. Also relevant is the total number of samples in the signal, sig_len. For each frequency bin, a software intermediate frequency bandpass filter, ifbpf, in terms of Fs, f_target, and f_width, may be defined along with an input signal software bandpass filter, INbf, to remove frequencies outside of the passband.

In operation an input signal SIGin is received, having power distributed over a signal frequency range. The input signal software bandpass filter, INbf, is applied to the input signal SIGin to produce a filtered input signal, which is normalized to produce a normalized signal power, SIGin_norm, which may be stored for use in various calculations.

For each frequency bin, a mixing frequency, f_mix, appropriate for translating from the frequency source f_source to the target IF frequency, f_target, may be calculated as f_mix=f_source−f_target.

A mixing stream, cos_mix, of length sig_len equal to the input signal length may then be calculated by evaluating the cosine function over the range from 0 to rads_per_signal in increments of rads_per_sample, which may be written as:
    cos_mix=cos(0:rads_per_sample:rads_per_signal), where
    rads_per_sample=f_mix*dt*2*pi, and
    rads_per_signal=rads_per_sample(sig_len-1)
The above equation for cos_mix is also the notation used in MATLAB® to calculate cos_mix.

An intermediate frequency (IF) signal, sig_IF, may be generated by using the formula, sig_IF=SIGin_norm*cos_mix.

The corresponding intermediate frequency bandpass filter, ifbpf, is applied to each intermediate frequency (IF) signal, sig_IF, to generate a filtered IF signal, sig_IF_filtered.

A bin power, bin_power, in the filtered IF signal, sig_IF_filtered, may be calculated by summing the square of the amplitudes in sig_IF_filtered and dividing this sum by the time interval, and stored.

The frequency bin having the maximum bin_power, max_power may be identified and used for various purposes. For example, the occupied bandwidth of the input signal may be calculated in various ways, such as by summing the frequency widths of frequency bins based on the bin power, bin_power, in each frequency bins proximate to the frequency bin with maximum power.

In various embodiments, the OBW may be calculated as a two-sided occupied bandwidth of the input signal by starting with the frequency width of the maximum power bin, then successively summing the frequency widths of the frequency bins with highest power adjacent on either side to the maximum power bin or to a previously summed frequency bin based until the sum of the power in the frequency power bins is equal to 99% or some desired percentage of the input signal power. The single-sided occupied bandwidth may be calculated by dividing the two-sided occupied bandwidth by two to provide an average or by summing the power in frequency bins spanning lower and higher frequencies, respectively, than the frequency bin with the maximum power.

Systems, devices, software, and methods of the present invention may be applied at many, if not all, of the various design and operational stages. In design stages, the present invention may be implemented in simulation software, as well as in the device and system level design and prototypes. In operation, the present invention may be implemented transmitters, repeaters, receivers, stand-alone signal monitoring devices and other devices in which in signal power measurements over a frequency spectrum may be of use, such as signal power monitors and control devices.

As may be disclosed, taught, and/or suggested herein to the skilled artisan, the present invention addresses the continuing need for hardware and/or software systems, devices, and methods that measure signal power, such as the OBW of signals, in software simulation or hardware transmission, and may be particularly of importance in the case of a highly non-stationary spectrum.

BRIEF DESCRIPTION OF THE DRAWINGS

Advantages of embodiments of the present invention will be apparent from the following detailed description of the exemplary embodiments thereof, which description should be considered in conjunction with the accompanying drawings, which are included for the purpose of exemplary illustration of various aspects of the present invention to aid in description, and not for purposes of limiting the invention.

Figure 1:
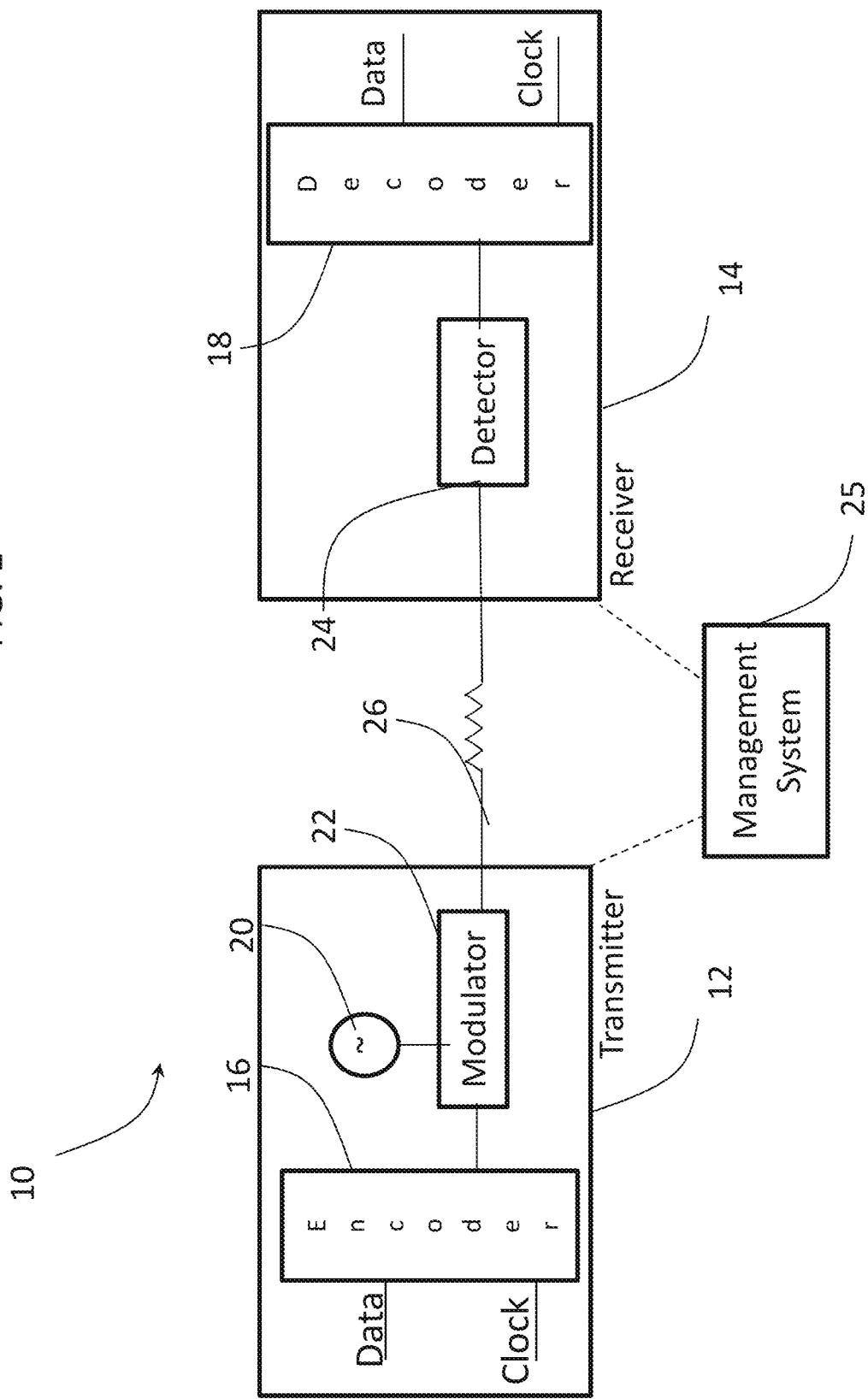
FIG. 1 illustrates exemplary data transmission systems.

In the drawings and detailed description, the same or similar reference numbers may identify the same or similar elements. It will be appreciated that the implementations, features, etc., described with respect to embodiments in specific figures may be implemented with respect to other embodiments in other figures, unless expressly stated, or otherwise not possible.

DETAILED DESCRIPTION OF THE INVENTION

Aspects of the invention are disclosed in the specification and related drawings, which may be directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description, a discussion of several terms used herein may be included.

The word "exemplary" is used herein to mean "serving as an example, instance, or illustration" and not as a limitation. Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Further, many embodiments are described in terms of sequences of actions to be performed by, for example, elements of a computing device. It will be recognized that various actions described herein can be performed by specific circuits (e.g., application specific integrated circuits (ASICs)), by field programmable gate arrays, by program instructions being executed by one or more processors, or by a combination thereof. Additionally, sequence(s) of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action. For example, it will be appreciated that transmitter, receivers, management systems, and other devices in systems of the present invention may include one or more processors, memory, storage, input and components, communication interfaces, as well as other components that may be interconnected as desired by the skilled artisan via one or more buses and circuit boards, cards, etc.

Figure 2:
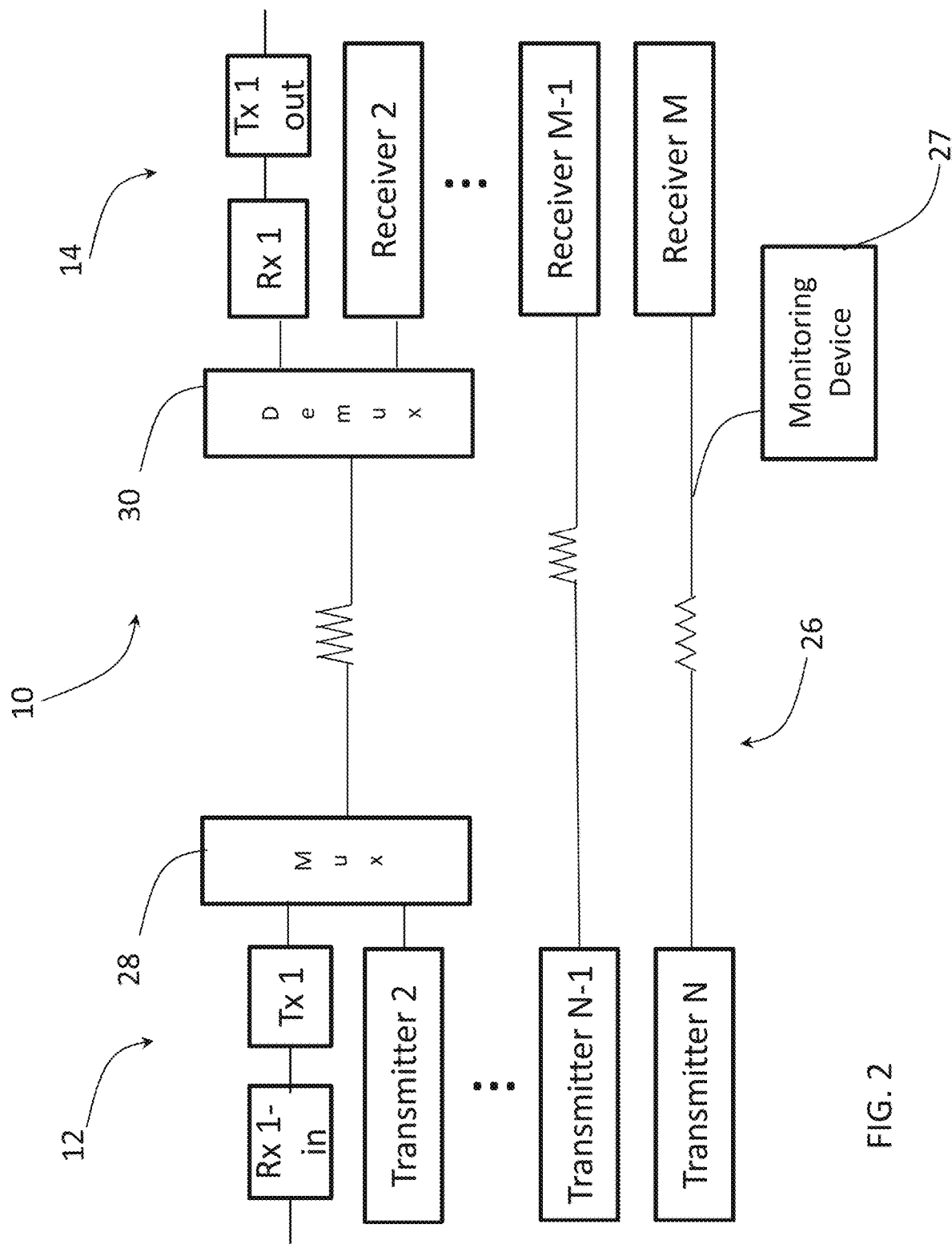
FIG. 2 illustrates exemplary data transmission systems.

FIG. 1 shows exemplary systems 10 including exemplary transmitter 12 and receiver 14 pairs that may be used in transmission or communication systems, such as further shown in FIG. 2. Bits, usually representing data/information, to be transmitted as a signal through the system 10 may be encoded in a channel encoder 16 section of the transmitter 12, as well as have other signal processing performed to prepare a signal for transmission. The encoded bits may then be used to modulate a carrier wave having a center frequency provided by a carrier source 20, or frequency source, using an external modulator 22 as shown in FIG. 1 or to directly modulate the carrier/frequency source 20 to produce the transmission signal. The signals may be transmitted using one carrier or multiple carriers simultaneously, such as when implemented with Instantaneous Spectral Analysis ("ISA"), see U.S. Pat. No. 10,069,664 incorporated above.

The encoder 16 and decoder 18 are shown as single blocks in FIG. 1. However, the encoder 16 and decoder 18 may include one or more stages/components that are used to process the information passing through the system 10. The encoding and decoding function may be performed inside and/or outside the transmitter 12 and receiver 14, as desired by the skilled artisan.

At the receiver 14, a detector 24 may detect the transmission signal and provide the transmission signal to signal processors, which may include the decoder 18 to perform any decoding necessary to output the bits. The bits output from the system 10 may be in the form of data and clock signals, or otherwise. In various embodiments, the system 10 may be locally and/or remotely monitored and/or controlled by a management system 25 as is known in the art. The system 10 may be deployed as part of a local private point-to-point network, as well as part of the global terrestrial and satellite infrastructure and managed accordingly.

FIG. 2 shows exemplary systems 10 that include a plurality of transmitters 12 and receivers 14 that may be deployed in various transmission and communication systems employing various wired and wireless transmission media 26 and may include PSW technology of the present invention. Signal monitoring may be performed at the transmitters, receivers, amplifiers/repeaters, and other devices in the system 10 and/or with stand-alone signal monitoring devices 27 deployed at various locations in the system 10. In various devices, the present invention may be implemented as software, including firmware, embedded logic, etc. that is stored in a computer readable medium, such as memory, drives, and other storage devices and executed by process running proximate (on or near) the devices as is known in the art.

Systems 10, such as shown in FIG. 1 and FIG. 2 and other systems, may be deployed in various electrical and optical wired transmission and communication networks, as well as satellite and terrestrial wireless networks. In various systems, the transmission signals may be multiplexed in a multiplexer 28 before transmission and may require demultiplexing before detection in a demultiplexer 30 after transmission, as is commonly performed in wired and wireless systems carrying multiple channels.

Systems, devices, and methods of the present invention have an electrical signal input, which may have been generated in hardware by receiving a data/information carrying signal, such an optical or radio signals, or in software by simulating the preceding reception. The analysis of the input signal may be performed pursuant to various analysis inputs provided by the user. For example, prior to analyzing the input signal with a center frequency, f_c, the user may specify a frequency spectrum range (f_range) having a minimum frequency (f_min) and a maximum frequency (f_max). Because the analysis is being performed in software and the input signal may be stored, the user may be able to vary the frequency range (f_range) of interest and re-run the analysis to assess the sensitivity of the analysis to various user inputs. One of skill in the art will appreciate that a range of user inputs may provide suitable results; however, increasing the number of calculations performed to produce the results may impact the latency of the results.

The user may define at least one frequency bin within the frequency spectrum range (f_range) and having a frequency width, f_width. This may be done by specifying the number of frequency bins and segmenting the frequency range (f_range) of interest accordingly. The width of each frequency bin is termed f_width. It is usually desirable to segment the frequency range evenly from an efficiency and ease of use standpoint, but there may be scenarios that it is preferred to unevenly segment the frequency range, such as in frequency ranges where the signal power is expected to change rapidly (narrow bins) and not change significantly (wide bins).

For each frequency bin, a target intermediate frequency (f_target) and corresponding software intermediate frequency bandpass filter, ifbpf, in terms of f_target, sampling frequency, Fs, and f_width may be defined. Various target intermediate frequencies may be selected by the skilled artisan depending upon the particular application of the present invention. The use of intermediate target frequencies enables the skilled artisan to translate the signal power to a lower frequency. For example, for RF signals in the range of 900 MHz, target intermediate frequencies may be in the range of 100 KHz. The intermediate frequency bandpass filter may be implemented using various techniques as known to those of skill in the art. For example, using the MathWorks® MATLAB® filter design tools, which may include the designfilt function.

For the signal power analysis, an input signal sample time interval, dt, may be selected to provide the sampling frequency, Fs=1/dt. The signal length sig_len may be determined from the length of the signal in samples. The sample time interval may be varied by the skilled artisan based on preference and the bit rate of the signal as will be discussed further herein.

Depending upon the particular application, it may be desirable to provide an input signal software bandpass filter, INbf, to remove frequencies outside of the passband. The bandpass filter may be implemented using various techniques as known to those of skill in the art, such as described above.

In operation, an input signal, SIGin having power distributed over a signal frequency range is received. The input signal software bandpass filter, INbf, may be applied to the input signal, SIGin to produce a filtered input signal, which is normalized to produce a normalized signal power, SIGin_norm, which may be stored for use in various calculations.

For each frequency bin, a mixing frequency, f_mix, appropriate for translating from a source frequency, f_source associated with the frequency bin to the target IF frequency, f_target, by mixing (i.e., by pairwise multiplication of samples of two streams), may be determined employing the equation $$2*\cos(a)*\cos(b)=\cos(a-b)+\cos(a+b) \text{ and}$$
$$\text{defining } a=f\_source \text{ and } b=f\_mix,$$

where $$f\_mix=f\_source-f\_target.$$

A mixing stream, cos_mix, of length sig_len equal to the input signal length may then be calculated by evaluating the cosine function over the range from 0 to rads_per_signal in increments of rads_per_sample, which may be written as:

cos_mix=cos(0:rads_per_sample:rads_per_signal),
where
rads_per_sample=f_mix*dt*2*pi, and
rads_per_signal=rads_per_sample(sig_len-1)

The above equation for cos_mix is also the notation used in MATLAB® to calculate cos_mix.

An intermediate frequency (IF) signal, sig_IF, may be generated using the formula, $$sig\_IF=SIGin\_norm*cos\_mix.$$

The corresponding bandpass filter, ifbpf, is applied to each intermediate frequency (IF) signal, sig_IF, to generate a filtered IF signal, sig_IF_filtered.

A bin power, bin_power, in the filtered IF signal, sig_IF_filtered, may be calculated by summing the square of the amplitudes in sig_IF_filtered and dividing this sum by the time interval, and stored.

The frequency bin having the maximum bin_power, max_power may be identified and used for various purposes. For example, the occupied bandwidth of the input signal may be calculated in various ways, such as by summing the frequency widths of frequency bins based on the bin power, bin_power, in each frequency bin proximate to the frequency bin with maximum power.

In various embodiments, the OBW may be calculated as a two-sided occupied bandwidth of the input signal by starting with the frequency width of the maximum power bin, then successively summing the frequency widths of the frequency bins with highest power adjacent on either side to the maximum power bin or to a previously summed frequency bin based until the sum of the power in the frequency power bins is equal to 99% or some desired percentage of the input signal power. The single-sided occupied bandwidth may be calculated by dividing the two-sided occupied bandwidth by two to provide an average or by summing the power in frequency bins spanning lower and higher frequencies, respectively, than the frequency bin with the maximum power.

The OBW may be calculated by successively summing power from the lowest frequency bin to the highest frequency bin and calculating the 99% OBW as the difference between the frequencies at which the 0.5% power and the 99.5% power is reached. This method may be used with the present invention. However, the method described above, which starts from the peak power frequency bin and successively expands to adjacent frequency power bins, may more accurately reflect the desire to define OBW as centered around the peak power. The two methods may be equivalent if the spectrum is symmetric around the peak power, but may diverge if for any reason the spectrum is not symmetric around the peak power.

Systems 10 and devices of the present invention include software and/or hardware to analyze signal power over a frequency range, which may be useful for OBW and other signal processing and control purposes. The signal analysis methods may be implemented at various points in the system 10 including the transmitters, receivers, and locations along a link as desired, for example, for feedback loops and link performance analyses.

The performance of the SSA of the present invention was compared to an HP 8590B hardware-based swept-tuned spectrum analyzer (HSTSA) for time amplitude sequences generated by the same Polynomial Symbol Waveform (PSW) alphabets that employ a time-varying signal spectrum. For more information on PSW alphabets, refer to U.S. Pat. No. 10,069,664 incorporated above, and U.S. patent application Ser. No. 16/735,655 filed Mar. 6, 2020 entitled "Devices, Systems, And Methods Employing Polynomial Symbol Waveforms", the contents of which is incorporated by reference in its entirety, except for the claims and any disclosure contrary to this disclosure. The comparison examines the impact of varying stream/ signal length, number of frequency bins, and bandpass filter length.

Figure 3:
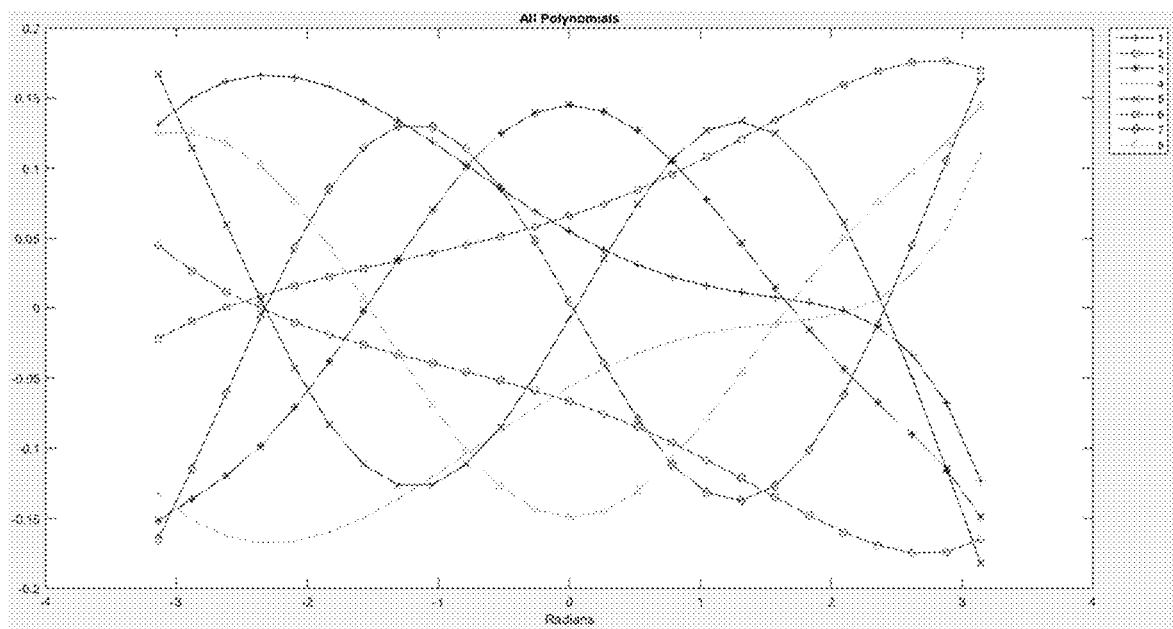
FIG. 3 illustrates an exemplary initial PSW alphabet.
Figure 4:
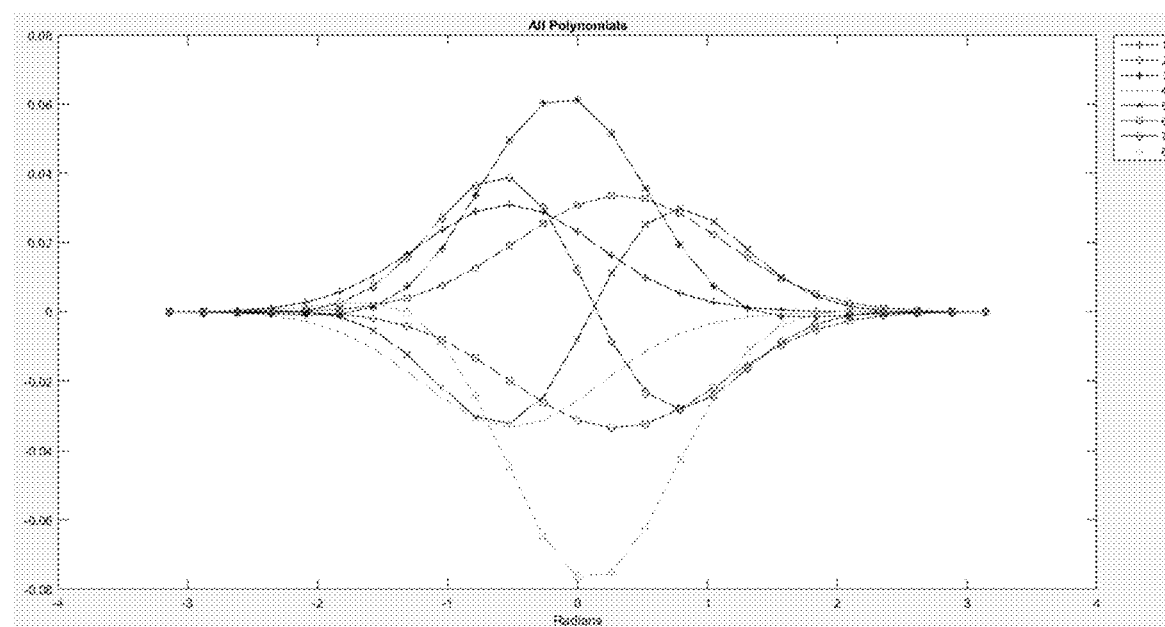
FIGS. 4-8 illustrates the exemplary initial PSW alphabet convolved with a polynomial corresponding to a Gaussian with mean zero and sigma values of 0.8, 1.0, 1.2, 1.6, and 2, respectively.
Figure 5:
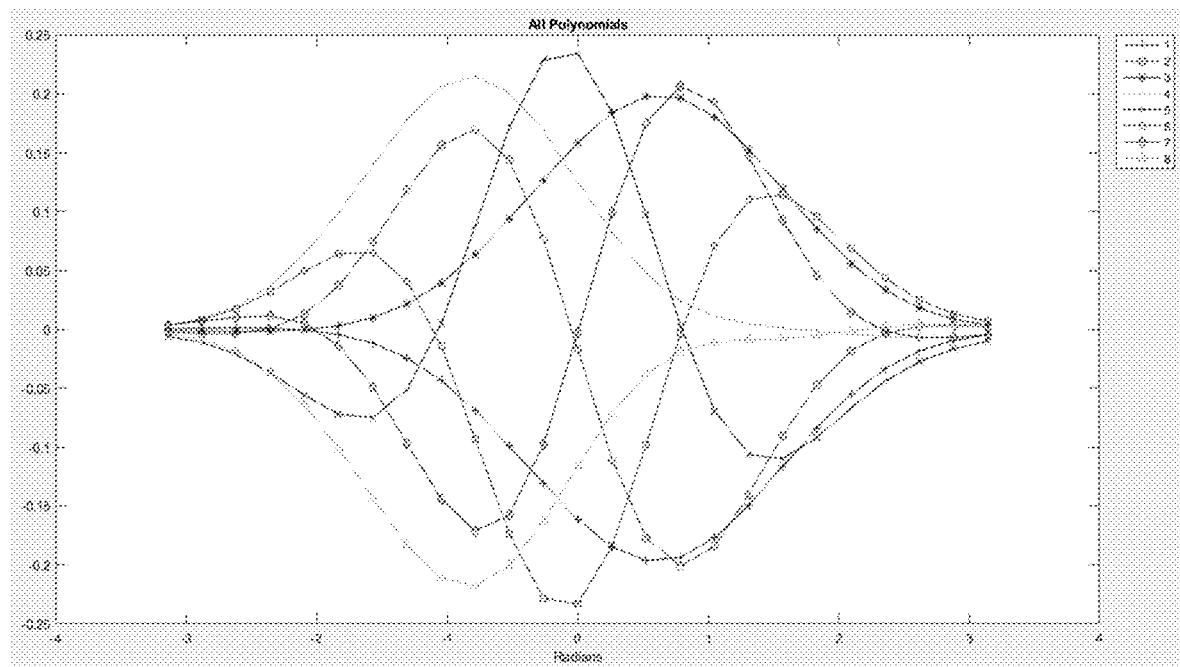
Figure 6:
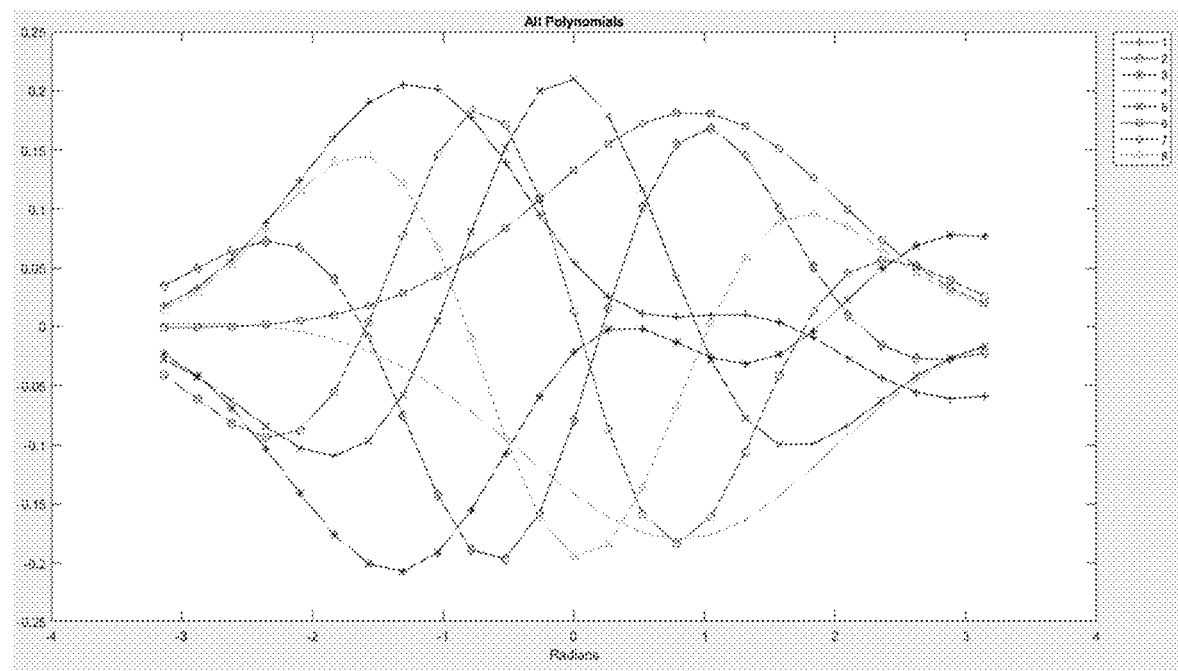
Figure 7:
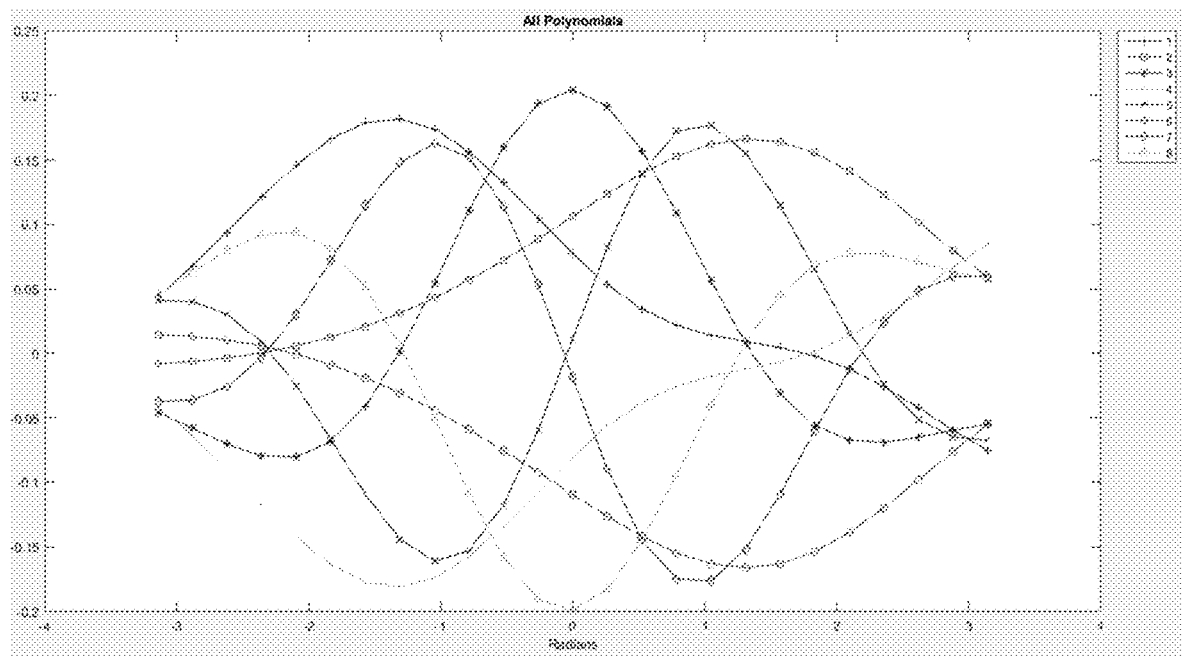
Figure 8:
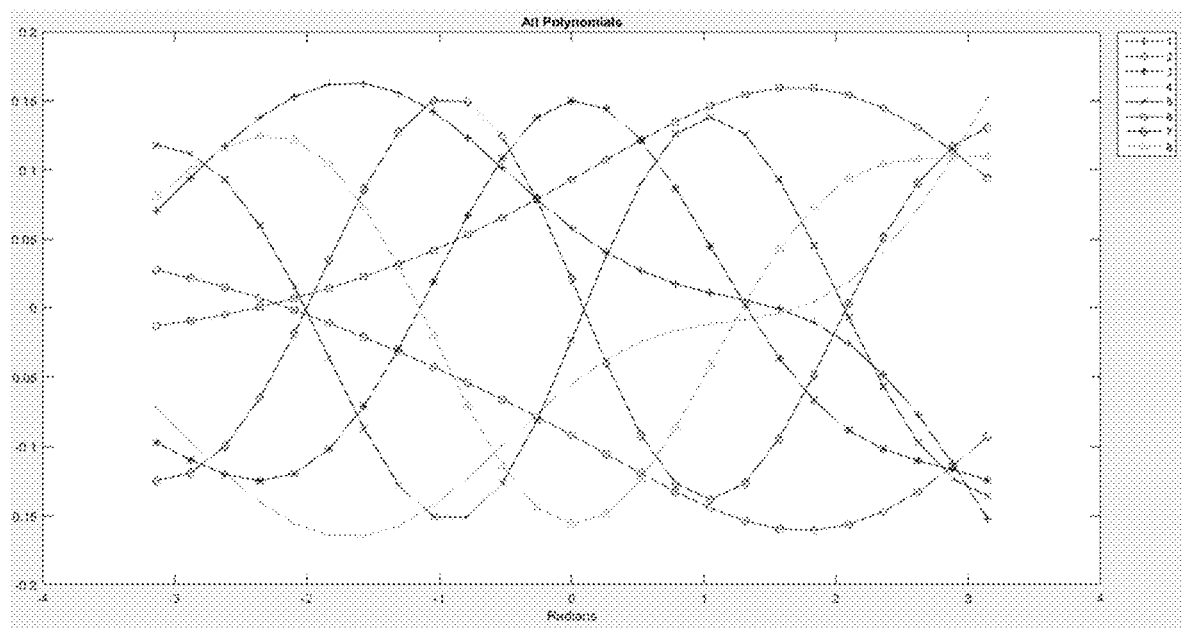

In the comparison, an initial set of 8 "polynomial symbol waveforms" (PSWs) were constructed as shown in FIG. 3, which may be collectively referred to as a PSW alphabet. To create PSW alphabets that would generate signals with different OBW properties, the initial PSW alphabet was convolved with a polynomial corresponding to a Gaussian with mean zero and sigma values of 0.8, 1.0, 1.2, 1.6, and 2, as shown in FIGS. 4-8, respectively. The initial PSW alphabet (which has very high OBW) was not tested, only the convolved PSW alphabets.

A three-bit sequence was assigned to each of the PSWs in each of the convolved PSW alphabets.

In the below discussion, "bit stream length" refers to the number of bits transmitted. The OBW measurements are based on analyzing time-amplitude sequences generated by converting a random sequence of bits into a corresponding random sequence of PSWs from a particular PSW alphabet. For purposes of this study, all PSW alphabets have 8 symbols, corresponding to bit sequences of length 3, and each polynomial symbol waveform is represented by 25 sample points.

For all analyses reported below, the following parameters apply:

Symbol time, dt=1 microseconds f_c=922 MHz, where f_c is the center frequency of the signal f_min=f_c−10 MHz f_max=f_c+10 MHz 30 trials per condition The one-sided OBW is reported.

OBW is measured in terms of the 99% power spectral density (PSD) width. Two approaches to OBW measurement were performed, although a multiple of other approaches may be selected by the skilled artisan.

Method I: Adding frequency power bins. Find the range of frequency power bins containing 99% of the signal power. The results of which are shown in FIGS. 9-12.

Figure 13:
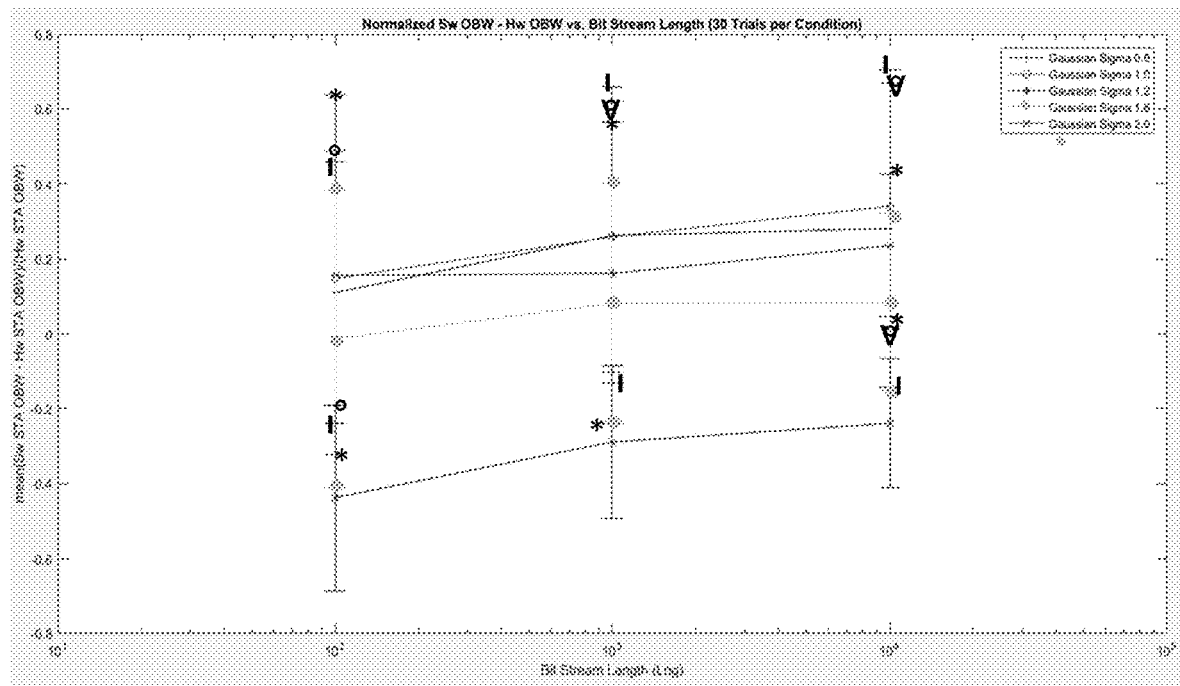
Figure 14:
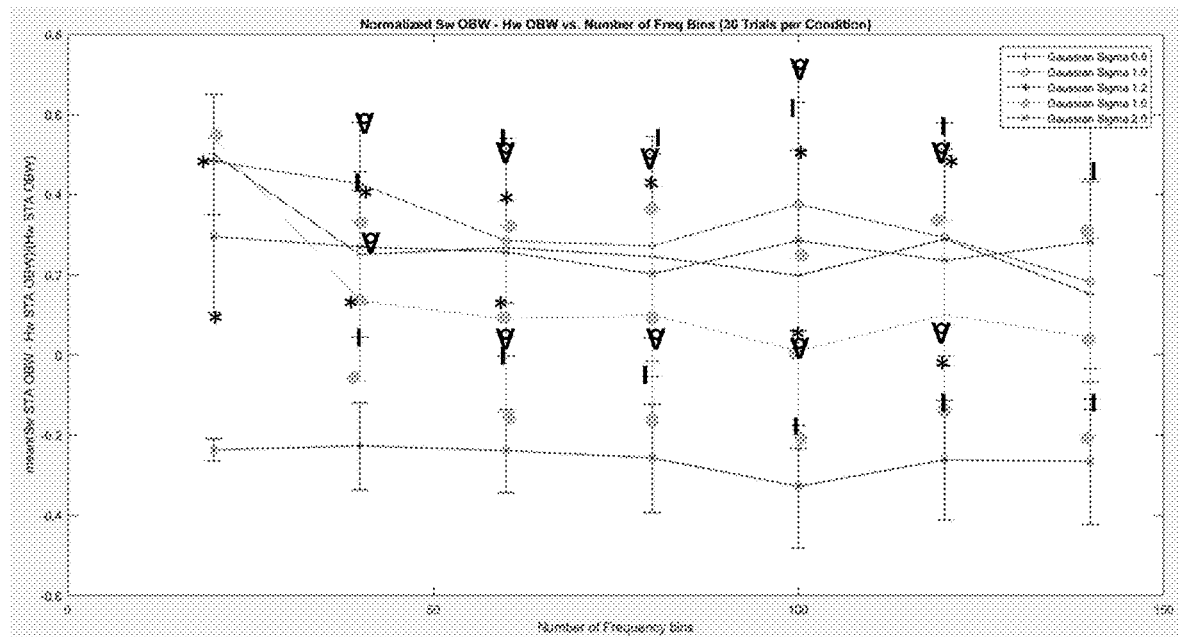
Figure 15:
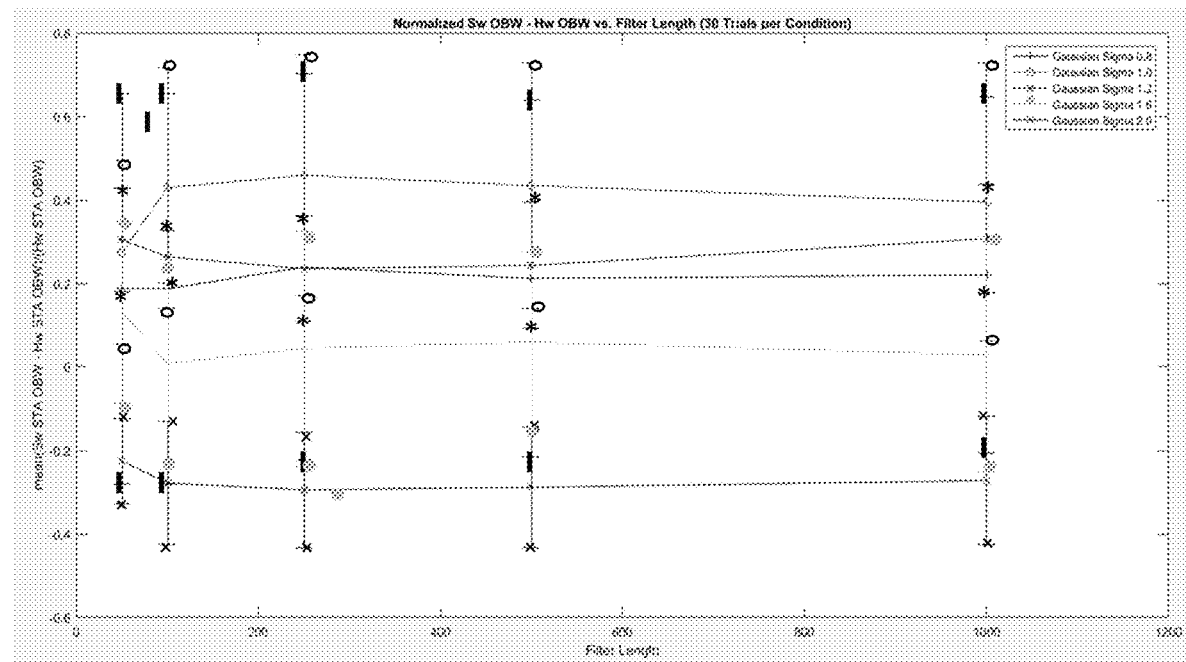

Method II: Find the frequency difference between the frequency bin of the maximum power point and the frequency bin of 1% signal power. The results of which are shown in FIGS. 13-15.

Method I generally produced better agreement with the HSTSA, and much better test/re-test consistency (lower standard deviation), as further described herein. The second approach produced reasonable results and may prove more appropriate for other applications.

The following data, derived from trials reported in more detail below, shows consistency between the SSA and the HSTSA to within less than 10%. A summary of the comparison is provided in Table 1 below.

TABLE 1

METHOD I: SSA AND HSTSA OBW COMPARISON

| PSW Alphabet | SSA OBW (MHz) | HSTSA OBW (MHz) |
|---|---|---|
| Gaussian σ = 0.8 | 3.4 | 3.2 |
| Gaussian σ = 1.0 | 2.9 | 2.7 |
| Gaussian σ = 1.2 | 2.7 | 2.6 |
| Gaussian σ = 1.6 | 2.5 | 2.6 |
| Gaussian σ = 2.0 | 6.0 | 6.6 |

This data shows consistency between the SSA and the HSTSA to within less than 10%.

Effect of Bit Stream Length on OBW Measurement

Figure 9:
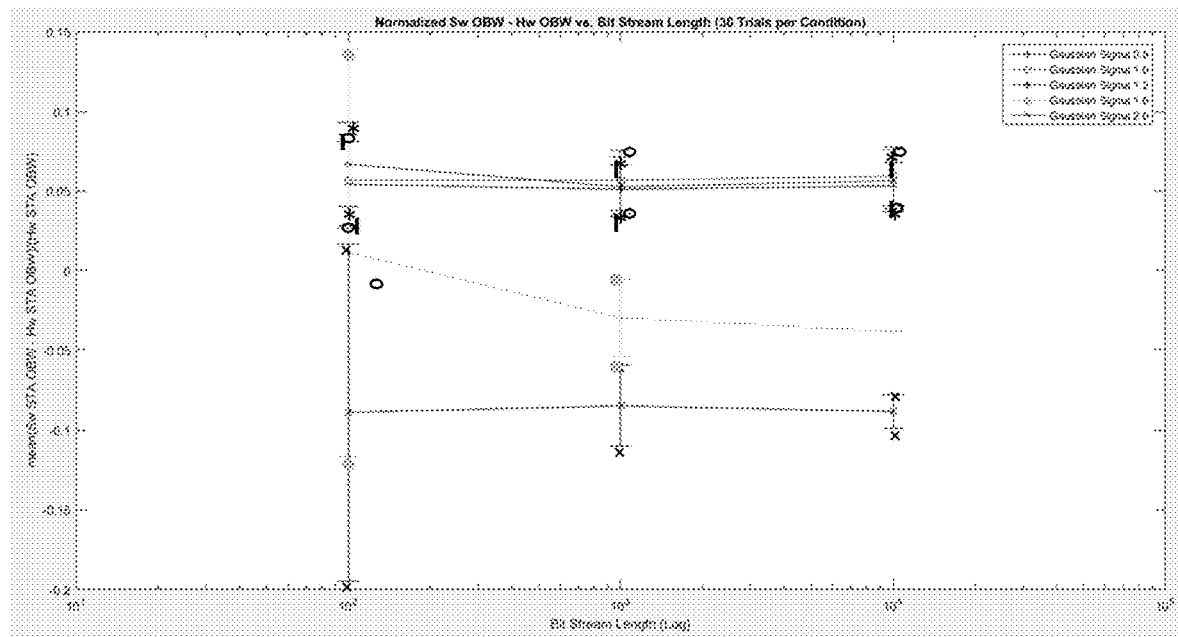
FIGS. 9-15 show the normalized difference between the SSA and HSTSA OBW calculation as a function of bit stream length, number of frequency bins, and IF filter length using two methods of calculating the OBW based on the calculated power in the frequency bins.

FIG. 9 shows several comparisons were made to examine the question of how the SSA performance is affected by the length (in bits) of the input stream (100, 1,000, 10,000). The SSA IF filter is of length 500 for the trials reported below. The number of frequency bins is 100.

The data used in FIG. 9 for the above figure are given below.

PSW=Gaussian Sigma 0.8, bit stream len=100, Normalized OBW Diff=0.054167(0.027136), HSTSA OBW=3.2e+06

PSW=Gaussian Sigma 0.8, bit stream len=1000, Normalized OBW Diff=0.051042(0.015317), HSTSA OBW=3.2e+06

PSW=Gaussian Sigma 0.8, bit stream len=10000, Normalized OBW Diff=0.053125(0.014565), HSTSA OBW=3.2e+06

PSW=Gaussian Sigma 1.0, bit stream len=100, Normalized OBW Diff=0.05679(0.028744), HSTSA OBW=2.7e+06

PSW=Gaussian Sigma 1.0, bit stream len=1000, Normalized OBW Diff=0.05679(0.018793), HSTSA OBW=2.7e+06

PSW=Gaussian Sigma 1.0, bit stream len=10000, Normalized OBW Diff=0.059259(0.018455), HSTSA OBW=2.7e+06

PSW=Gaussian Sigma 1.2, bit stream len=100, Normalized OBW Diff=0.066667(0.026596), HSTSA OBW=2.6e+06

PSW=Gaussian Sigma 1.2, bit stream len=1000, Normalized OBW Diff=0.052564(0.018851), HSTSA OBW=2.6e+06

PSW=Gaussian Sigma 1.2, bit stream len=10000, Normalized OBW Diff=0.05641(0.019516), HSTSA OBW=2.6e+06

PSW=Gaussian Sigma 1.6, bit stream len=100, Normalized OBW Diff=0.011538(0.12822), HSTSA OBW=2.6e+06

PSW=Gaussian Sigma 1.6, bit stream len=1000, Normalized OBW Diff=−0.029487(0.024079), HSTSA OBW=2.6e+06

PSW=Gaussian Sigma 1.6, bit stream len=10000, Normalized OBW Diff=−0.038462(0), HSTSA OBW=2.6e+06

PSW=Gaussian Sigma 2.0, bit stream len=100, Normalized OBW Diff=−0.088889(0.1057), HSTSA OBW=6.6e+06

PSW=Gaussian Sigma 2.0, bit stream len=1000, Normalized OBW Diff=−0.084848(0.025353), HSTSA OBW=6.6e+06

PSW=Gaussian Sigma 2.0, bit stream len=10000, Normalized OBW Diff=−0.088384(0.01059), HSTSA OBW=6.6e+06

The (logarithmic) x-axis provides the number of bits transmitted. In FIGS. 9-15, the y-axis provides the mean normalized difference between the SSA and the HSTSA OBW for matched conditions with the standard deviation over 30 trials per condition provided in parentheses. The HSTSA value is provided as the last number of each line. The standard deviations are indicated by the error bars.

Note that while the SSA OBW results are provided for between 100 and 10,000 simulated transmitted bits, the comparison is against HSTSA OBW based on 1.5 million bits transmitted.

These data show that the mean SSA OBW measurement agrees with the HSSTA to within less than 10% for 100 or more simulated bits transmitted. The standard deviation in the difference between the SSA and HSSTA measurements decreases with more bits transmitted.

In operation, the SSA stores the entire input sequence and analyzes it repeatedly for different frequency bins, whereas the HSTSA analyzes different parts of the input signal for each frequency bin. This allows the SSA to be more compact than the HSTSA in terms of required input sequence length.

Figure 10:
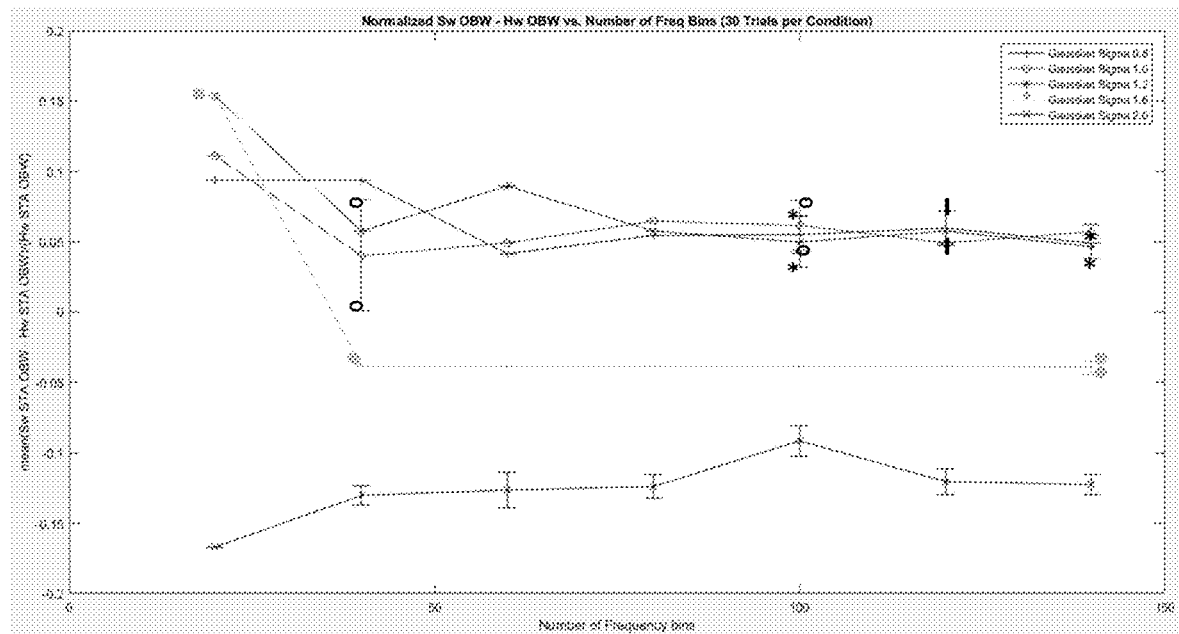

FIG. 10 show a comparison of the SSA performance as affected by the number of frequency bins (20, 40, 60, 80, 100, 120, 140). The number of bits transmitted is 10,000 and the SSA IF filter length is 500. The x-axis provides the number of frequency bins. The y-axis provides the mean normalized difference between the SSA and the HSTSA OBW for matched conditions. The standard deviations are indicated by the error bars based on the following data.

PSW=Gaussian Sigma 0.8, f_num =20, Normalized OBW Diff=0.09375(0), HSTSA OBW=3.2e+06
PSW=Gaussian Sigma 0.8, f_num =40, Normalized OBW Diff=0.09375(0), HSTSA OBW=3.2e+06
PSW=Gaussian Sigma 0.8, f_num =60, Normalized OBW Diff=0.041667(0), HSTSA OBW=3.2e+06
PSW=Gaussian Sigma 0.8, f_num =80, Normalized OBW Diff=0.054688(0), HSTSA OBW=3.2e+06
PSW=Gaussian Sigma 0.8, f_num =100, Normalized OBW Diff=0.055208(0.013443), HSTSA OBW=3.2e+06
PSW=Gaussian Sigma 0.8, f_num =120, Normalized OBW Diff=0.059896(0.012138), HSTSA OBW=3.2e+06
PSW=Gaussian Sigma 0.8, f_num =140, Normalized OBW Diff=0.049107(0), HSTSA OBW=3.2e+06
PSW=Gaussian Sigma 1.0, f_num =20, Normalized OBW Diff=0.11111(0), HSTSA OBW=2.7e+06
PSW=Gaussian Sigma 1.0, f_num =40, Normalized OBW Diff=0.040123(0.039832), HSTSA OBW=2.7e+06
PSW=Gaussian Sigma 1.0, f_num =60, Normalized OBW Diff=0.049383(0), HSTSA OBW=2.7e+06
PSW=Gaussian Sigma 1.0, f_num =80, Normalized OBW Diff=0.064815(0), HSTSA OBW=2.7e+06
PSW=Gaussian Sigma 1.0, f_num =100, Normalized OBW Diff=0.061728(0.017758), HSTSA OBW=2.7e+06
PSW=Gaussian Sigma 1.0, f_num =120, Normalized OBW Diff=0.049383(0), HSTSA OBW=2.7e+06
PSW=Gaussian Sigma 1.0, f_num =140, Normalized OBW Diff=0.057319(0.00483), HSTSA OBW=2.7e+06
PSW=Gaussian Sigma 1.2, f_num =20, Normalized OBW Diff=0.15385(0), HSTSA OBW=2.6e+06
PSW=Gaussian Sigma 1.2, f_num =40, Normalized OBW Diff=0.057692(0), HSTSA OBW=2.6e+06
PSW=Gaussian Sigma 1.2, f_num =60, Normalized OBW Diff=0.089744(0), HSTSA OBW=2.6e+06
PSW=Gaussian Sigma 1.2, f_num =80, Normalized OBW Diff=0.057692(0), HSTSA OBW=2.6e+06
PSW=Gaussian Sigma 1.2, f_num =100, Normalized OBW Diff=0.05(0.017927), HSTSA OBW=2.6e+06
PSW=Gaussian Sigma 1.2, f_num =120, Normalized OBW Diff=0.057692(0), HSTSA OBW=2.6e+06
PSW=Gaussian Sigma 1.2, f_num =140, Normalized OBW Diff=0.046703(0.0083827), HSTSA OBW=2.6e+06
PSW=Gaussian Sigma 1.6, f_num =20, Normalized OBW Diff=0.15385(0), HSTSA OBW=2.6e+06
PSW=Gaussian Sigma 1.6, f_num =40, Normalized OBW Diff=−0.038462(0), HSTSA OBW=2.6e+06
PSW=Gaussian Sigma 1.6, f_num =60, Normalized OBW Diff=−0.038462(0), HSTSA OBW=2.6e+06
PSW=Gaussian Sigma 1.6, f_num =80, Normalized OBW Diff=−0.038462(0), HSTSA OBW=2.6e+06
PSW=Gaussian Sigma 1.6, f_num =100, Normalized OBW Diff=−0.038462(0), HSTSA OBW=2.6e+06
PSW=Gaussian Sigma 1.6, f_num =120, Normalized OBW Diff=−0.038462(0), HSTSA OBW=2.6e+06
PSW=Gaussian Sigma 1.6, f_num =140, Normalized OBW Diff=−0.039377(0.0050158), HSTSA OBW=2.6e+06
PSW=Gaussian Sigma 2.0, f_num =20, Normalized OBW Diff=−0.16667(0), HSTSA OBW=6.6e+06
PSW=Gaussian Sigma 2.0, f_num =40, Normalized OBW Diff=−0.13005(0.0069157), HSTSA OBW=6.6e+06
PSW=Gaussian Sigma 2.0, f_num =60, Normalized OBW Diff=−0.12626(0.012583), HSTSA OBW=6.6e+06
PSW=Gaussian Sigma 2.0, f_num =80, Normalized OBW Diff=−0.12374(0.0085185), HSTSA OBW=6.6e+06
PSW=Gaussian Sigma 2.0, f_num =100, Normalized OBW Diff=−0.091414(0.010885), HSTSA OBW=6.6e+06
PSW=Gaussian Sigma 2.0, f_num =120, Normalized OBW Diff=−0.12037(0.0089793), HSTSA OBW=6.6e+06
PSW=Gaussian Sigma 2.0, f_num =140, Normalized OBW Diff=−0.12229(0.0071619), HSTSA OBW=6.6e+06

Figure 11:
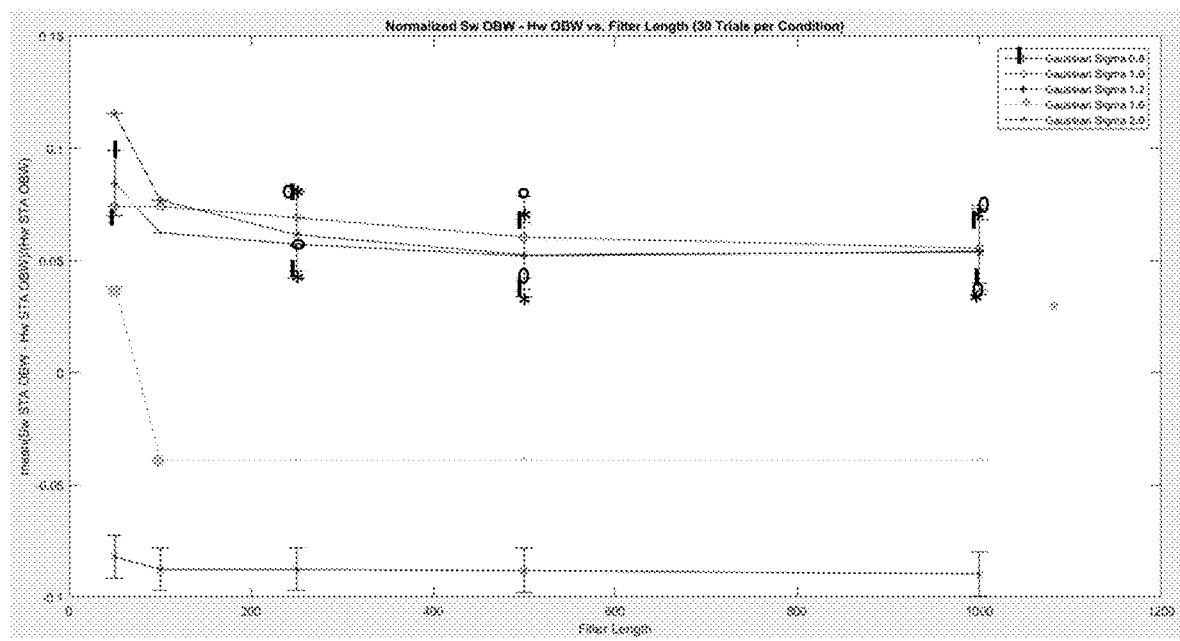

FIG. 11 show a comparison between the SSA and the HSTSA as a function of the length of the SSA IF filter (50, 100, 250, 500, 1000). The bit stream length is 10,000 for the trials reported below. The number of frequency bins is 100. The x-axis provides the SSA IF filter length. The y-axis provides the mean normalized difference between the SSA and the HSTSA OBW for matched conditions. The standard deviations are indicated by the error bars.

The data used to generate FIG. 11 is as follows:
PSW=Gaussian Sigma 0.8, filter len=50, Normalized OBW Diff=0.084375(0.014565), HSTSA OBW=3.2e+06
PSW=Gaussian Sigma 0.8, filter len=100, Normalized OBW Diff=0.0625(0), HSTSA OBW=3.2e+06
PSW=Gaussian Sigma 0.8, filter len=250, Normalized OBW Diff=0.057292(0.011845), HSTSA OBW=3.2e+06
PSW=Gaussian Sigma 0.8, filter len=500, Normalized OBW Diff=0.052083(0.014983), HSTSA OBW=3.2e+06
PSW=Gaussian Sigma 0.8, filter len=1000, Normalized OBW Diff=0.054167(0.014056), HSTSA OBW=3.2e+06
PSW=Gaussian Sigma 1.0, filter len=50, Normalized OBW Diff=0.074074(0), HSTSA OBW=2.7e+06
PSW=Gaussian Sigma 1.0, filter len=100, Normalized OBW Diff=0.074074(0), HSTSA OBW=2.7e+06
PSW=Gaussian Sigma 1.0, filter len=250, Normalized OBW Diff=0.069136(0.012805), HSTSA OBW=2.7e+06
PSW=Gaussian Sigma 1.0, filter len=500, Normalized OBW Diff=0.060494(0.018153), HSTSA OBW=2.7e+06
PSW=Gaussian Sigma 1.0, filter len=1000, Normalized OBW Diff=0.055556(0.018835), HSTSA OBW=2.7e+06
PSW=Gaussian Sigma 1.2, filter len=50, Normalized OBW Diff=0.11538(0), HSTSA OBW=2.6e+06

PSW=Gaussian Sigma 1.2, filter len=100, Normalized OBW Diff=0.076923(0), HSTSA OBW=2.6e+06

PSW=Gaussian Sigma 1.2, filter len=250, Normalized OBW Diff=0.061538(0.019164), HSTSA OBW=2.6e+06

PSW=Gaussian Sigma 1.2, filter len=500, Normalized OBW Diff=0.052564(0.018851), HSTSA OBW=2.6e+06

PSW=Gaussian Sigma 1.2, filter len=1000, Normalized OBW Diff=0.053846(0.019164), HSTSA OBW=2.6e+06

PSW=Gaussian Sigma 1.6, filter len=50, Normalized OBW Diff=0.038462(0), HSTSA OBW=2.6e+06

PSW=Gaussian Sigma 1.6, filter len=100, Normalized OBW Diff=-0.038462(0), HSTSA OBW=2.6e+06

PSW=Gaussian Sigma 1.6, filter len=250, Normalized OBW Diff=-0.038462(0), HSTSA OBW=2.6e+06

PSW=Gaussian Sigma 1.6, filter len=500, Normalized OBW Diff=-0.038462(0), HSTSA OBW=2.6e+06

PSW=Gaussian Sigma 1.6, filter len=1000, Normalized OBW Diff=-0.038462(0), HSTSA OBW=2.6e+06

PSW=Gaussian Sigma 2.0, filter len=50, Normalized OBW Diff=-0.081818(0.009416), HSTSA OBW=6.6e+06

PSW=Gaussian Sigma 2.0, filter len=100, Normalized OBW Diff=-0.087374(0.0094858), HSTSA OBW=6.6e+06

PSW=Gaussian Sigma 2.0, filter len=250, Normalized OBW Diff=-0.087374(0.0094858), HSTSA OBW=6.6e+06

PSW=Gaussian Sigma 2.0, filter len=500, Normalized OBW Diff=-0.087879(0.010066), HSTSA OBW=6.6e+06

PSW=Gaussian Sigma 2.0, filter len=1000, Normalized OBW Diff=-0.089394(0.010027), HSTSA OBW=6.6e+06

For purposes of efficient run-time, particularly when used as part of PSW alphabet design, an important question is how light-weight can the SSA parameters be, while maintaining performance. Based on the data used in FIGS. 9-11, the following parameters were selected to allow for efficient execution:

Bits transmitted: 10,000
Number of frequency bins: 100
IF filter length: 100

Figure 12:
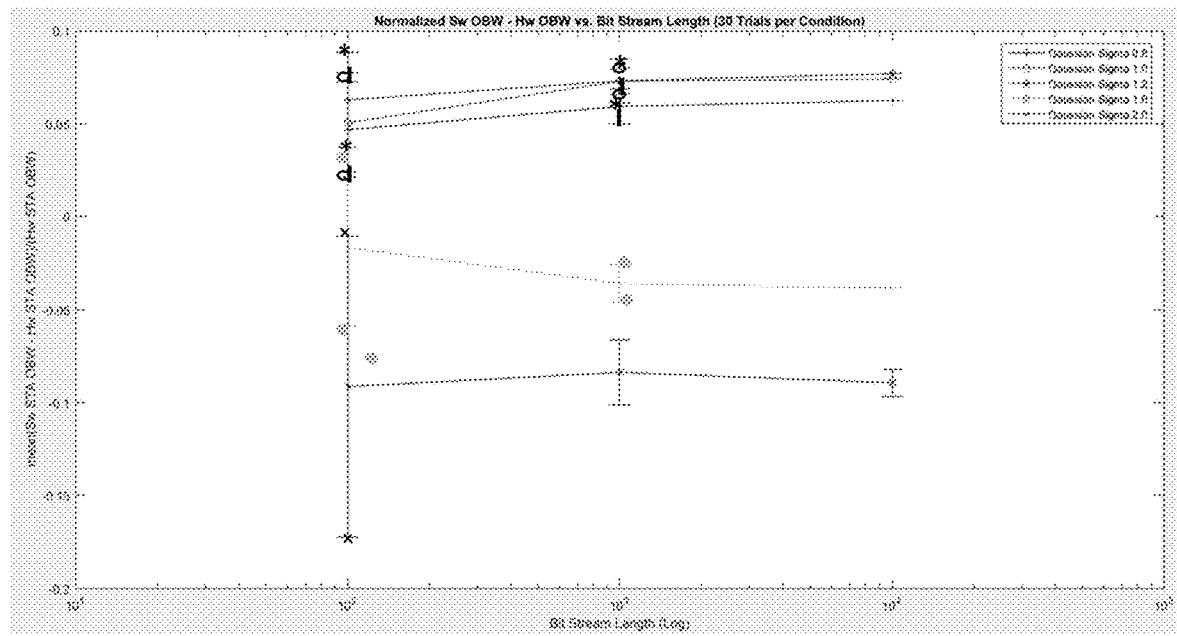

FIG. 12 shows the variation as a function of the number of bits transmitted as 100, 1,000, and 10,000.

FIGS. 13-15 show comparison analogous to the comparisons shown in FIGS. 9-11, but using Method II of calculating the OBW instead of Method I. A summary of the comparison is provided in Table 2 below.

TABLE 2

METHOD II: SSA AND HSTSA OBW COMPARISON

| PSW Alphabet | SSA OBW (MHz) | HSTSA OBW (MHz) |
|---|---|---|
| Gaussian σ = 0.8 | 3.6 | 3.2 |
| Gaussian σ = 1.0 | 3.0 | 2.7 |
| Gaussian σ = 1.2 | 3.0 | 2.6 |
| Gaussian σ = 1.6 | 2.0 | 2.6 |
| Gaussian σ = 2.0 | 5.0 | 6.6 |

For the Method II comparison, the number of bits transmitted was 1.5 million for both the SSA and the HSTSA. The data shows consistency between the SSA and the HSTSA to within about 20%, which is worse than for Method I as documented above. Also, Method II calculation has a standard deviation across trials that is much higher. These results may suggest that for these alphabets, Method I may be preferred based on the HSTSA comparison or the time averaging of the HSTSA does not adequately capture the spectrum, or some combination thereof.

FIG. 13 shows the Method II SSA performance as a function of the length (in bits) of the input stream. The SSA IF filter length is 500 and the number of frequency bins is 100, which yielded the following data with the standard deviation over 30 trials per condition provided in parentheses. The HSTSA value is provided as the last number of each line.

PSW=Gaussian Sigma 0.8, bit stream len=100, Normalized OBW Diff=0.11042(0.34922), HSTSA OBW=3.2e+06

PSW=Gaussian Sigma 0.8, bit stream len=1000, Normalized OBW Diff=0.2625(0.39542), HSTSA OBW=3.2e+06

PSW=Gaussian Sigma 0.8, bit stream len=10000, Normalized OBW Diff=0.28125(0.4235), HSTSA OBW=3.2e+06

PSW=Gaussian Sigma 1.0, bit stream len=100, Normalized OBW Diff=0.14815(0.34015), HSTSA OBW=2.7e+06

PSW=Gaussian Sigma 1.0, bit stream len=1000, Normalized OBW Diff=0.25926(0.36132), HSTSA OBW=2.7e+06

PSW=Gaussian Sigma 1.0, bit stream len=10000, Normalized OBW Diff=0.34074(0.32918), HSTSA OBW=2.7e+06

PSW=Gaussian Sigma 1.2, bit stream len=100, Normalized OBW Diff=0.15641(0.48038), HSTSA OBW=2.6e+06

PSW=Gaussian Sigma 1.2, bit stream len=1000, Normalized OBW Diff=0.16154(0.40166), HSTSA OBW=2.6e+06

PSW=Gaussian Sigma 1.2, bit stream len=10000, Normalized OBW Diff=0.2359(0.1905), HSTSA OBW=2.6e+06

PSW=Gaussian Sigma 1.6, bit stream len=100, Normalized OBW Diff=-0.012821(0.39744), HSTSA OBW=2.6e+06

PSW=Gaussian Sigma 1.6, bit stream len=1000, Normalized OBW Diff=0.082051(0.31744), HSTSA OBW=2.6e+06

PSW=Gaussian Sigma 1.6, bit stream len=10000, Normalized OBW Diff=0.084615(0.23761), HSTSA OBW=2.6e+06

PSW=Gaussian Sigma 2.0, bit stream len=100, Normalized OBW Diff=-0.43737(0.24743), HSTSA OBW=6.6e+06

PSW=Gaussian Sigma 2.0, bit stream len=1000, Normalized OBW Diff=-0.28889(0.20394), HSTSA OBW=6.6e+06

PSW=Gaussian Sigma 2.0, bit stream len=10000, Normalized OBW Diff=-0.23939(0.17167), HSTSA OBW=6.6e+06

FIG. 14 shows the Method II SSA performance as a function of the number of frequency bins (20, 40, 60, 80, 100, 120, 140). The number of bits transmitted is 10000 and the SSA IF filter is of length 500. The x-axis provides the number of frequency bins. The y-axis provides the mean normalized difference between the SSA and the HSTSA OBW for matched conditions. The standard deviations are indicated by the error bars for the following data.

PSW=Gaussian Sigma 0.8, f_num =20, Normalized OBW Diff=0.5(0.15132), HSTSA OBW=3.2e+06

PSW=Gaussian Sigma 0.8, f_num =40, Normalized OBW Diff=0.25(0.20517), HSTSA OBW=3.2e+06

PSW=Gaussian Sigma 0.8, f_num =60, Normalized OBW Diff=0.26736(0.27092), HSTSA OBW=3.2e+06

PSW=Gaussian Sigma 0.8, f_num =80, Normalized OBW Diff=0.24479(0.29868), HSTSA OBW=3.2e+06

PSW=Gaussian Sigma 0.8, f_num =100, Normalized OBW Diff=0.19792(0.4321), HSTSA OBW=3.2e+06

PSW=Gaussian Sigma 0.8, f_num =120, Normalized OBW Diff=0.28819(0.29077), HSTSA OBW=3.2e+06

PSW=Gaussian Sigma 0.8, f_num =140, Normalized OBW Diff=0.15179(0.28583), HSTSA OBW=3.2e+06

PSW=Gaussian Sigma 1.0, f_num =20, Normalized OBW Diff=0.48148(0), HSTSA OBW=2.7e+06

PSW=Gaussian Sigma 1.0, f_num =40, Normalized OBW Diff=0.42593(0.15494), HSTSA OBW=2.7e+06

PSW=Gaussian Sigma 1.0, f_num =60, Normalized OBW Diff=0.28395(0.23957), HSTSA OBW=2.7e+06

PSW=Gaussian Sigma 1.0, f_num =80, Normalized OBW Diff=0.2716(0.22802), HSTSA OBW=2.7e+06

PSW=Gaussian Sigma 1.0, f_num =100, Normalized OBW Diff=0.37531(0.34288), HSTSA OBW=2.7e+06

PSW=Gaussian Sigma 1.0, f_num =120, Normalized OBW Diff=0.29218(0.21865), HSTSA OBW=2.7e+06

PSW=Gaussian Sigma 1.0, f_num =140, Normalized OBW Diff=0.18166(0.24946), HSTSA OBW=2.7e+06

PSW=Gaussian Sigma 1.2, f_num =20, Normalized OBW Diff=0.29487(0.18851), HSTSA OBW=2.6e+06

PSW=Gaussian Sigma 1.2, f_num =40, Normalized OBW Diff=0.26923(0.13923), HSTSA OBW=2.6e+06

PSW=Gaussian Sigma 1.2, f_num =60, Normalized OBW Diff=0.25641(0.12776), HSTSA OBW=2.6e+06

PSW=Gaussian Sigma 1.2, f_num =80, Normalized OBW Diff=0.20192(0.21685), HSTSA OBW=2.6e+06

PSW=Gaussian Sigma 1.2, f_num =100, Normalized OBW Diff=0.28462(0.22418), HSTSA OBW=2.6e+06

PSW=Gaussian Sigma 1.2, f_num =120, Normalized OBW Diff=0.23504(0.2613), HSTSA OBW=2.6e+06

PSW=Gaussian Sigma 1.2, f_num =140, Normalized OBW Diff=0.28205(0.31525), HSTSA OBW=2.6e+06

PSW=Gaussian Sigma 1.6, f_num =20, Normalized OBW Diff=0.53846(0), HSTSA OBW=2.6e+06

PSW=Gaussian Sigma 1.6, f_num =40, Normalized OBW Diff=0.13462(0.19786), HSTSA OBW=2.6e+06

PSW=Gaussian Sigma 1.6, f_num =60, Normalized OBW Diff=0.089744(0.23265), HSTSA OBW=2.6e+06

PSW=Gaussian Sigma 1.6, f_num =80, Normalized OBW Diff=0.099359(0.26325), HSTSA OBW=2.6e+06

PSW=Gaussian Sigma 1.6, f_num =100, Normalized OBW Diff=0.010256(0.23361), HSTSA OBW=2.6e+06

PSW=Gaussian Sigma 1.6, f_num =120, Normalized OBW Diff=0.10043(0.23331), HSTSA OBW=2.6e+06

PSW=Gaussian Sigma 1.6, f_num =140, Normalized OBW Diff=0.043956(0.24741), HSTSA OBW=2.6e+06

PSW=Gaussian Sigma 2.0, f_num =20, Normalized OBW Diff=−0.23737(0.027663), HSTSA OBW=6.6e+06

PSW=Gaussian Sigma 2.0, f_num =40, Normalized OBW Diff=−0.22727(0.10969), HSTSA OBW=6.6e+06

PSW=Gaussian Sigma 2.0, f_num =60, Normalized OBW Diff=−0.23906(0.10438), HSTSA OBW=6.6e+06

PSW=Gaussian Sigma 2.0, f_num =80, Normalized OBW Diff=−0.25758(0.13552), HSTSA OBW=6.6e+06

PSW=Gaussian Sigma 2.0, f_num =100, Normalized OBW Diff=−0.32828(0.15268), HSTSA OBW=6.6e+06

PSW=Gaussian Sigma 2.0, f_num =120, Normalized OBW Diff=−0.26178(0.14972), HSTSA OBW=6.6e+06

PSW=Gaussian Sigma 2.0, f_num =140, Normalized OBW Diff=−0.26623(0.15725), HSTSA OBW=6.6e+06

FIG. 15 shows the Method II SSA performance as a function of the length of the SSA IF filter (50, 100, 250, 500, 1000). The bit stream length is 10000 for the trials reported below. The number of frequency bins is 100.

PSW=Gaussian Sigma 0.8, filter len=50, Normalized OBW Diff=0.1875(0.46713), HSTSA OBW=3.2e+06

PSW=Gaussian Sigma 0.8, filter len=100, Normalized OBW Diff=0.1875(0.46713), HSTSA OBW=3.2e+06

PSW=Gaussian Sigma 0.8, filter len=250, Normalized OBW Diff=0.23958(0.4631), HSTSA OBW=3.2e+06

PSW=Gaussian Sigma 0.8, filter len=500, Normalized OBW Diff=0.2125(0.42757), HSTSA OBW=3.2e+06

PSW=Gaussian Sigma 0.8, filter len=1000, Normalized OBW Diff=0.22083(0.42666), HSTSA OBW=3.2e+06

PSW=Gaussian Sigma 1.0, filter len=50, Normalized OBW Diff=0.27407(0.22043), HSTSA OBW=2.7e+06

PSW=Gaussian Sigma 1.0, filter len=100, Normalized OBW Diff=0.42963(0.28732), HSTSA OBW=2.7e+06

PSW=Gaussian Sigma 1.0, filter len=250, Normalized OBW Diff=0.45926(0.28797), HSTSA OBW=2.7e+06

PSW=Gaussian Sigma 1.0, filter len=500, Normalized OBW Diff=0.43457(0.2934), HSTSA OBW=2.7e+06

PSW=Gaussian Sigma 1.0, filter len=1000, Normalized OBW Diff=0.39506(0.33303), HSTSA OBW=2.7e+06

PSW=Gaussian Sigma 1.2, filter len=50, Normalized OBW Diff=0.30513(0.12368), HSTSA OBW=2.6e+06

PSW=Gaussian Sigma 1.2, filter len=100, Normalized OBW Diff=0.2641(0.062862), HSTSA OBW=2.6e+06

PSW=Gaussian Sigma 1.2, filter len=250, Normalized OBW Diff=0.2359(0.12605), HSTSA OBW=2.6e+06

PSW=Gaussian Sigma 1.2, filter len=500, Normalized OBW Diff=0.24359(0.15128), HSTSA OBW=2.6e+06

PSW=Gaussian Sigma 1.2, filter len=1000, Normalized OBW Diff=0.30769(0.12935), HSTSA OBW=2.6e+06

PSW=Gaussian Sigma 1.6, filter len=50, Normalized OBW Diff=0.13077(0.21771), HSTSA OBW=2.6e+06

PSW=Gaussian Sigma 1.6, filter len=100, Normalized OBW Diff=0.0076923(0.25097), HSTSA OBW=2.6e+06

PSW=Gaussian Sigma 1.6, filter len=250, Normalized OBW Diff=0.04359(0.28186), HSTSA OBW=2.6e+06

PSW=Gaussian Sigma 1.6, filter len=500, Normalized OBW Diff=0.058974(0.21539), HSTSA OBW=2.6e+06

PSW=Gaussian Sigma 1.6, filter len=1000, Normalized OBW Diff=0.028205(0.27881), HSTSA OBW=2.6e+06

PSW=Gaussian Sigma 2.0, filter len=50, Normalized OBW Diff=−0.22525(0.10181), HSTSA OBW=6.6e+06

PSW=Gaussian Sigma 2.0, filter len=100, Normalized OBW Diff=−0.27778(0.14697), HSTSA OBW=6.6e+06

PSW=Gaussian Sigma 2.0, filter len=250, Normalized OBW Diff=−0.29394(0.13787), HSTSA OBW=6.6e+06

PSW=Gaussian Sigma 2.0, filter len=500, Normalized OBW Diff=−0.28788(0.14363), HSTSA OBW=6.6e+06

PSW=Gaussian Sigma 2.0, filter len=1000, Normalized OBW Diff=−0.27172(0.15359), HSTSA OBW=6.6e+06

Figure 16:
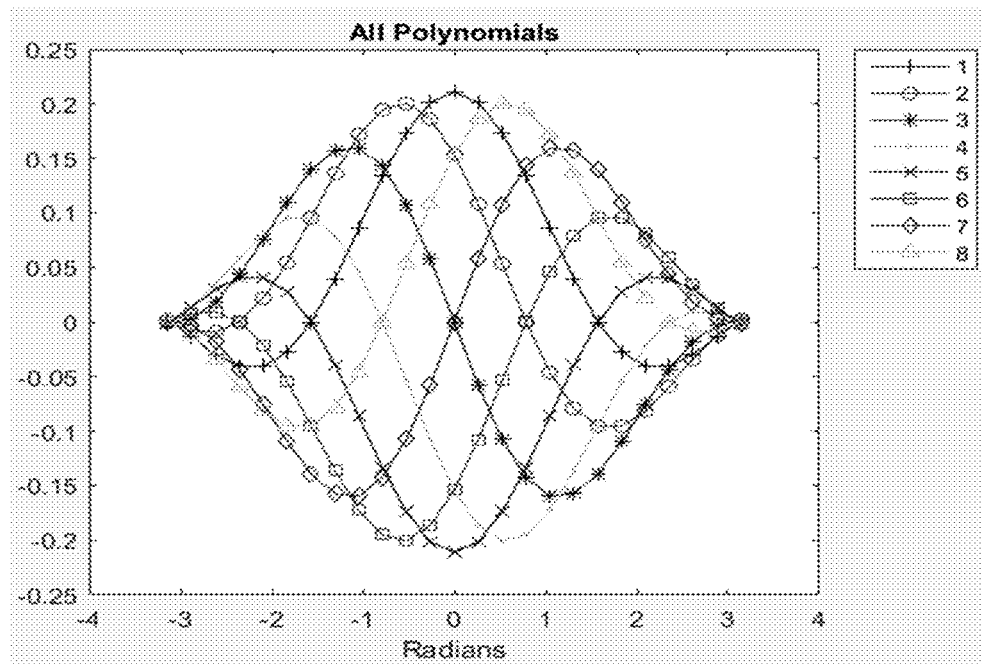
FIG. 16 shows an eight (8) polynomial symbol waveform (PSW) alphabet corresponding to a Root Raised Cosine (RRC)-filtered 8-PSK symbol waveform alphabet.

FIG. 16 shows an eight (8) polynomial symbol waveform (PSW) alphabet corresponding to Root Raised Cosine (RRC)-filtered 8-Phase Shift Keying (PSK) waveforms. PSK waveforms are based on sinusoids with constant amplitude, and therefore produce a relatively stationary spectrum, to within filtering and symbol boundary effects. As such, FT-based spectrum analysis techniques may be used to accurately analyze the PSK signals. The PSW alphabet corresponding to 8-PSK was constructed by starting with 8 sinusoidal polynomials having even phase offsets between them, then convolving with a polynomial corresponding to an RRC with $\alpha$=0.1.

The SSA of the present invention was used in MATLAB® software simulations to calculate the OBW at 99% power for the 8-PSK waveform. In addition, the OBW was also calculated using the MATLAB® FT-based OBW function called obw. The OBW calculated using the SSA and FT-based techniques were in close agreement to within a few percent. Hence, the present invention has demonstrated good performance for signals with a stationary spectrum when compared to FT-based techniques and for signals with a non-stationary spectrum when compared to HSTSA techniques.

The foregoing description and accompanying drawings illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A method of identifying signal waveforms for signal transmission, comprising:
    receiving, via a processor, an input signal, SIGin, comprising signal waveforms
    specifying, via a processor, a frequency spectrum range corresponding to the input signal, SIGin,
        the frequency spectrum range having a minimum frequency (f_min) and a maximum frequency (f_max);
    defining, via the processor, at least one frequency bin within the frequency spectrum range and having a frequency width, f_width and a frequency source, f_source, associated with the frequency bin;
    specifying, via the processor, a target intermediate frequency (f_target) for each frequency bin;
    identifying, via the processor, a time interval between signal samples, dt;
    calculating, via the processor, a sampling frequency, Fs=1/dt and a signal sample length, sig_len;
    defining, via the processor, for each frequency bin, a software intermediate frequency bandpass filter, ifbpf, in terms of Fs, f_target, and f_width;
    defining, via the processor, an input signal software bandpass filter, INbf, to remove frequencies outside of the frequency spectrum range;
    receiving, via the processor, the input signal, SIGin having power distributed over a signal frequency range;
    applying, via the processor, the input signal software bandpass filter, INbf, to the input signal, SIGin to produce a filtered input signal;
    normalizing, via the processor, the filtered input signal to produce a normalized signal power, SIGin_norm;
    storing, via the processor in a memory, the normalized signal power, SIGin_norm;
    calculating, via the processor, for each frequency bin, a mixing frequency, f_mix, where f_mix=f_source−f_target;

calculating, via the processor, for each frequency bin, a mixing stream, cos_mix, where
        cos_mix=cos(0:rads_per_sample:rads_per_signal), where
            rads_per_sample=f_mix*dt*2*$\pi$, and
            rads_per_signal=rads_per_sample*(sig_len-1).
    generating, via the processor, for each frequency bin, an intermediate frequency (IF) signal, sig_IF, where sig_IF=SIGin_norm*cos_mix.
    applying, via the processor, for each frequency bin, the bandpass filter, ifbpf, to sig_IF to generate a filtered IF signal, sig_IF_filtered;
    calculating, via the processor, for each frequency bin, a bin power, bin_power, in the filtered IF signal, sig_IF_filtered, by summing the square of the amplitudes in sig_IF_filtered and dividing this sum by the time interval;
    storing, via the processor and in the memory, for each frequency bin, the bin power;
    identifying, via the processor, the frequency bin with the maximum bin_power, max_power_idx;
    calculating, via the processor, the occupied bandwidth of the input signal by summing the frequency widths of frequency bins based on the bin power, bin_power, in each frequency bin until a predetermined percentage of the input signal power is reached; and
    identifying waveforms for transmission based on the occupied bandwidth of the input signal.

2. The method of claim 1, where calculating includes calculating a two-sided occupied bandwidth of the input signal by starting with the frequency width of the maximum power bin, then successively summing the frequency widths of the frequency bins with highest power adjacent on either side to the maximum power bin or to a previously summed frequency bin based until the sum of the power in the frequency power bins is equal to 99% or some desired percentage of the input signal power.

3. The method of claim 2, where calculating includes calculating the single-sided occupied bandwidth by dividing the two-sided occupied bandwidth by two.

4. The method of claim 1, where the input signal, SIGin, is received from at least one of a transmitter, a receiver, a monitoring device, and a software signal simulation.

5. The method of claim 1, where the processor and memory are in at least one of a transmitter, a receiver, a monitoring device, and a computer running software signal transmission simulation on the processor.

6. The method of claim 1, further comprising:
adjusting where the center frequency of at least one frequency source based on the identified frequency bin with the maximum bin_power.

7. The method of claim 1, further comprising:
defining a software input signal bandpass filter, IN-bf; and
applying the input signal bandpass filter, IN-bf, to an input signal, SIGin, to remove frequencies outside of the frequency pass band from the input signal, SIGin.

8. A non-transitory computer readable medium storing instructions for identifying waveforms for signal transmission, the instructions comprising:
one or more instructions which, when executed by one or more processors, cause the one or more processors to:
receive an input signal over a time interval, dt, and having a signal length, sig_len, and power distributed over an input frequency spectrum;
normalize the input signal power to produce normalized signal power, SIGin_norm;
calculate, for each frequency bin,
a mixing frequency, f_mix, where
f_mix=f_source−f_target, where
f_target=a target intermediate frequency for signal in the frequency bin,
f_source =a frequency associated with the frequency bin,
and a mixing stream, cos_mix, where
cos_mix=cos(0:rads_per_sample:rads_per_signal), and where
rads_per_sample=f_mix*dt*2*π,
rads_per_signal=rads_per_sample*(sig_len-1);
generate, for each of the at least one frequency bin, an intermediate frequency signal, sig_IF=SIGin_norm*cos_mix;
apply, for each of the at least one frequency bin, an intermediate frequency (IF) bandpass filter, ifbpf, to sig_IF to generate a filtered IF signal, sig_IF_filtered;
calculate, for each of the at least one frequency bin, a bin power, bin_power, of the filtered IF signal by summing the square of the amplitudes in filtered IF signal and dividing this sum by the time interval, dt; and
identify waveforms for signal transmission based on the calculated bin power.

9. The non-transitory computer readable medium of claim 8,
where the one or more processors are located at least proximate at least one of the transmitter, the receiver, the signal monitoring device, a management system.

10. The non-transitory computer readable medium of claim 8, the instructions further comprising:
one or more instructions which, when executed by the one or more processors, cause the one or more processors to:
calculate the occupied bandwidth of the input signal by summing the frequency widths of frequency bins based on the bin power, bin_power, in each frequency bin.

11. The non-transitory computer readable medium of claim 10, where instructions to calculate the occupied bandwidth include instructions to:
identifying the frequency bin with the maximum bin_power, max_power_idx;
iteratively sum the power in the frequency bins starting with the bin corresponding to max_power_idx and by on each iteration,
add the power of a frequency bin with a successively lower or successively higher bin index, whichever contains more power,
stop the summing when the summed power is equal or greater than a predetermined percentage of the input signal power, and
stop the frequency corresponding to the lowest frequency bin used in the sum from the frequency corresponding to the highest frequency bin used in the sum to define the OBW, obwp, corresponding to the predetermined percentage.

12. The non-transitory computer readable medium of claim 11, where the predetermined percentage is 99%.

13. The non-transitory computer readable medium claim 8, where instructions to calculate the occupied bandwidth include instructions to
calculate a two-sided occupied bandwidth of the input signal by starting with the frequency width of the maximum power bin, then successively summing the frequency widths of the frequency bins with highest power adjacent on either side to the maximum power bin or to a previously summed frequency bin based until the sum of the power in the frequency power bins is equal to 99% or some desired percentage of the input signal power.

14. The non-transitory computer readable medium of claim 13, where instructions to calculate the occupied bandwidth include instructions to
calculate the single-sided occupied bandwidth by dividing the two-sided occupied bandwidth by two.

15. The non-transitory computer readable medium of claim 8, where the input signal, SIGin, is received from at least one of a transmitter, a receiver, a monitoring device, and a software signal simulation.

16. The non-transitory computer readable medium of claim 8, the instructions further comprising:
one or more instructions which, when executed by the one or more processors, cause the one or more processors to:
adjust where the center frequency of at least one frequency source based on the identified frequency bin with the maximum bin_power.

17. The non-transitory computer readable medium of claim 8, the instructions further comprising:
one or more instructions which, when executed by the one or more processors, cause the one or more processors to:
define a software input signal bandpass filter, IN-bf; and
apply the input signal bandpass filter, IN-bf, to an input signal, SIGin, to remove frequencies outside of the frequency pass band from the input signal, SIGin.

* * * * *